United States Patent

Huang et al.

[11] Patent Number: 6,004,864
[45] Date of Patent: Dec. 21, 1999

[54] ION IMPLANT METHOD FOR FORMING TRENCH ISOLATION FOR INTEGRATED CIRCUIT DEVICES

[75] Inventors: Ji-Chung Huang; Han-Liang Tseng; Chia-Hsiang Chen; Kuo-Sheng Chuang, all of Hsin-Chu, Taiwan

[73] Assignee: Taiwan Semiconductor Manufacturing Company Ltd., Hsin-Chu, Taiwan

[21] Appl. No.: 09/030,195

[22] Filed: Feb. 25, 1998

[51] Int. Cl.⁶ .................................................. H01L 21/76
[52] U.S. Cl. ........................... 438/433; 438/424; 438/526; 438/527; 438/529; 438/530; 148/DIG. 50
[58] Field of Search ................................. 438/424, 433, 438/435, 437, 527, 529, 530, 526, DIG. 50

[56] References Cited

U.S. PATENT DOCUMENTS

| | | | |
|---|---|---|---|
| 5,068,202 | 11/1991 | Crotti et al. | 437/67 |
| 5,118,636 | 6/1992 | Hosaka | 437/35 |
| 5,350,941 | 9/1994 | Madan | 257/647 |
| 5,395,790 | 3/1995 | Lur | 437/69 |
| 5,401,998 | 3/1995 | Chiu et al. | 257/368 |
| 5,468,676 | 11/1995 | Mandan | 437/70 |
| 5,643,822 | 7/1997 | Furukawa et al. | 437/67 |
| 5,668,044 | 9/1997 | Ohno | 438/433 |

Primary Examiner—Trung Dang
Attorney, Agent, or Firm—George O. Saile; Stephen B. Ackerman

[57] ABSTRACT

A method is described for forming trench isolation for integrated circuits on silicon wafers by selectively doping the trench regions by ion implantation and then etching these areas with a wet chemical etch. A dopant such as boron, is implanted in a sequence of energies and doses to provide a desired trench profile of heavily doped silicon. The implanted silicon etches far more rapidly than the surrounding silicon and is readily etched out forming a trench. The concentration of dopant diminishes rapidly in the periphery of the implanted region. As the etch front approaches the periphery, the silicon etch rate, likewise diminishes and the etch can be quenched to leave a uniform surface layer of enhanced boron concentration which lines the resultant trench to form an effective channel stop. Wet etched trenches provide advantages over trenches formed by RIE including smooth rounded trench profiles which reduce stress. In addition, trenches having widths below 0.25 microns and essentially vertical walls can readily be formed.

22 Claims, 3 Drawing Sheets

ION IMPLANT METHOD FOR FORMING TRENCH ISOLATION FOR INTEGRATED CIRCUIT DEVICES

BACKGROUND OF THE INVENTION (1) Field of the Invention

The invention relates to processes for the manufacture of semiconductor devices and more particularly to processes for forming field isolation.

(2) Description of Prior Art

The method of local oxidation of silicon(LOCOS) to form field oxide isolation around semiconductive devices built into the surface of silicon wafers has been practiced for over twenty-five years and has been adapted to many specific applications. In the process, a non-oxidizable mask of silicon nitride is formed over a thin layer of pad oxide grown on a blank silicon wafer. The mask is patterned by well known photolithographic methods and the wafer is oxidized, typically in steam, at temperatures in the neighborhood of 1,000° C. The mask is patterned so that, after oxidation, mesa like regions of silicon are surrounded by a region of silicon oxide insulation. The semiconductive devices are then formed on the silicon mesas.

Over the years many problems with LOCOS have surfaced which have been addressed in a great variety of ways. Most notable are the problems which deal with the growth of oxide under the mask(birds beak) and the resultant uneven surface topology over the field oxide.

These problems still persist and become aggravated as the technology tends towards smaller, shallower devices at high densities. In addition new difficulties are encountered, for example, the field oxide thinning effect, which manifests itself when field oxide is grown by LOCOS in mask openings of less than about 0.5 to 0.6 microns. Many of these difficulties arise from the high stresses produced, not only by the growing oxide, but also by the nitride oxidation mask. High shearing stresses, caused by abrupt features in the silicon/silicon oxide profile, are produced in the silicon. These stresses lead to the formation of dislocations which propagate into the device active regions causing junction failure.

A promising replacement for LOCOS field oxide isolation has been found in trench isolation. Although deep trench isolation(DTI) has been used nearly as long as LOCOS for bipolar transistor isolation, it has not been widely practiced in the manufacture of MOSFET integrated circuits. More recently, however, as device densities increase and isolation widths become smaller, shallow trench isolation(STI) is gaining favor over LOCOS in MOSFET technology.

The Trenches are formed in the silicon around the semiconductor devices by reactive ion etching. They are then filled either entirely with silicon oxide or lined with silicon oxide and filled with another material such as polysilicon. Generally the trenches have vertical walls with high aspect ratios and thus it is difficult to provide sufficient dopant in the walls of the trenches to prevent channel formation which causes current leakage between adjacent MOSFET devices.

Furukawa, et. al., U.S. Pat. No. 5,643,822 forms trenches 0.1 to 10 microns deep and between 0.1 and 2 microns wide. Reactive ion etching(RIE) is used to form the trench using a mask with sidewall spacers. After the trench is formed, the spacers are removed and the base of the trench and a narrow region of silicon at the upper edge of the trench are implanted to form a channel stop.

Madan, U.S. Pat. Nos. 5,350,941 and 5,468,676 combines the use of LOCOS and trench isolation. The trenches are formed after a LOCOS oxidation process using anisotropic etching and a p-type dopant is then incorporated into the trench walls to form a channel stop. The dopant is either ion implanted or diffused from a deposited film source. Lur, U.S. Pat. No. 5,395,790 forms a recessed LOCOS isolation by first etching a trench in the silicon and then forming the LOCOS oxide.

Chiu, et.al, U.S. Pat. No. 5,401,998 forms trenches with sidewalls having an angle of 54.7 degrees with respect to the top surface of the wafer. Thereby a 0° ion implantation is able to form a continuous channel stop along the entire surface of the trench. The trenches are formed by the anisotropic silicon etchant KOH on the <100> oriented silicon wafer. Narrow, high aspect ratio trench isolation required by current technology cannot be achieved by this method. Crotti, et.al., U.S. Pat. No. 5,068,202 forms trenches for field isolation using isotropic plasma etching with $CF_4+O_2$. The etching is done using a pad oxide/silicon nitride/silicon oxide mask stack with sidewalls. The sidewalls function to reduce the design opening defined by the mask stack to compensate for the undercut produced by the isotropic plasma etch. The opening has a grossly rounded profile which permits implantation of a channel stop over the entire trench surface.

In another effort to form a uniform dopant concentration on the sidewalls and bottom of the trench for the purpose of providing reliable current channeling stop, Hosaka, U.S. Pat. No. 5,118,636 heavily dopes the entire trench region by ion implantation through the trench definition mask prior to opening the trench by RIE. The ion implantation is performed by a prescribed variation of implantation energy during the procedure to obtain the desired doping gradation within the trench region. Thereafter the trench is formed by reactive ion etching.

There are several problems associated with this procedure. One is that the directionality of the reactive ion etch is, to a large extent, not dependent on the doping profile and therefore there exists a high probability that the doping concentration at the base of the trench will be less than that along the sidewalls. The process window for the etch is therefore very narrow.

A second problem, which is also common to processes wherein RIE is used to form the trench, occurs when trench widths are scaled down to 0.25 microns and below. Here, RIE processing begins to fail with regards to vertical sidewalls due to polymer formation which tends to restrict penetration in deep trenches. FIG. 1 illustrates this point by showing a cross section a portion of a silicon wafer 10 with a trench opening 20 having a design width larger than about 0.25 microns and another trench opening 22 having a design width of less than 0.25 microns. The etch mask 11 comprises a pad oxide 12, a silicon nitride layer 14, and a photoresist layer 16. The mask 11 is initially formed by patterning the photoresist layer 16 using conventional photolithographic methods and then etching the opening in the pad oxide and silicon nitride layers by RIE procedures well known by those in the art.

When trenches in the silicon are etched by RIE, a polymer is formed along the silicon sidewall. The polymer protects the sidewalls from lateral etching. In the larger (>0.25 micron) opening 20 the steady state polymer buildup on the sidewalls 19 is small compared to the width of the opening and therefore does not obstruct the vertical etching. In contrast, the steady state polymer buildup 18 in the smaller (>0.25 micron) opening 22 is significant compared to the width of the opening and therefore tends to narrow and eventually close off the etching front, resulting in a tapered, undersized trench.

Other difficulties associated with isolation trenches formed by RIE include plasma damage, not so much at the base of the trench but in the upper portions where sensitive gate oxides are formed. RIE formed trenches generally have sharp corners which cause the formation of stress and crystal dislocations during subsequent oxidation. The dislocations propagate diagonally from the corners into junction areas resulting in junction leakage and shorts.

SUMMARY OF THE INVENTION

It is an object of this invention to provide a method for forming trenches for shallow trench isolation by wet etching.

It is another object of this invention to provide a method for forming high aspect ratio trenches in silicon with essentially vertical sidewalls having trench widths of less than 0.25 microns.

It is yet another object of this invention to provide a method for forming trenches in silicon with essentially uniform p-type doping in their surface.

It is yet another object of this invention to provide a method for forming high aspect ratio trenches in silicon with essentially vertical sidewalls and an essentially uniform p-type doping surface.

It is still another object of this invention to provide a method for forming a trench field isolation region between devices on a silicon wafer with a high resistance to leakage currents between said devices.

It is yet another object of this invention to provide a method for forming high aspect ratio trenches in silicon with essentially vertical sidewalls and It is yet another object of this invention to provide a method for forming trenches in silicon without abrupt corners.

It is another object of this invention to provide a method for forming a trench field isolation region between devices on a silicon wafer with reduced stress, thereby reducing junction leakage and shorts caused by stress induced crystal dislocations.

It is another object of this invention to provide a method for forming a trench field isolation region on a silicon wafer having trench widths of less than 0.25 microns and trench depths of greater than 0.5 microns and essentially vertical trench sidewalls.

These objects are accomplished by implanting dopant ions into a region wherein a trench is to be formed. The dopant ions are selected to be of opposite type from the base silicon into which they are implanted. The implantation is tailored to provide a high concentration of dopant ions in the bulk of the region which is to form the trench. The concentration then falls off rapidly at the edges of that region. The implanted region is then etched by a wet etch. The wet etch rate is faster in the heavily implanted region and also falls off rapidly as the dopant concentration decreases in the periphery of the implanted region.

The resultant trench opened by the wet etchant therefore has essentially the same profile as the implanted region. The etching is quenched at a point when a desired concentration of dopant has been reached so that the resultant trench is uniformly lined with a thin layer of a type opposite from the base silicon thereby providing an effective continuous channel stop.

In addition the very nature of the wet etching combined with the smooth continuous dopant profile produces a trench without abrupt features like sharp corners which can create high stress regions during subsequent processing.

The wet etch process of this invention does not have the problem of polymer encroachment which limits the width of trenches formed by RIE. High aspect ratio trenches having vertical walls and widths well below 0.25 microns are achievable.

DESCRIPTION OF THE PREFERRED EMBODIMENT

Figure 1:
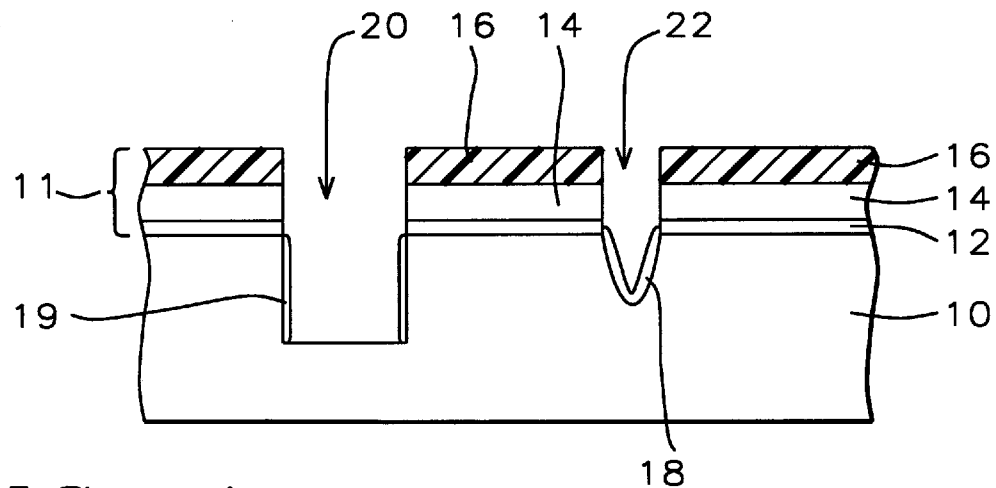
FIG. 1 is a cross section of a wide trench and a narrow trench etched into silicon by RIE.
Figure 2:
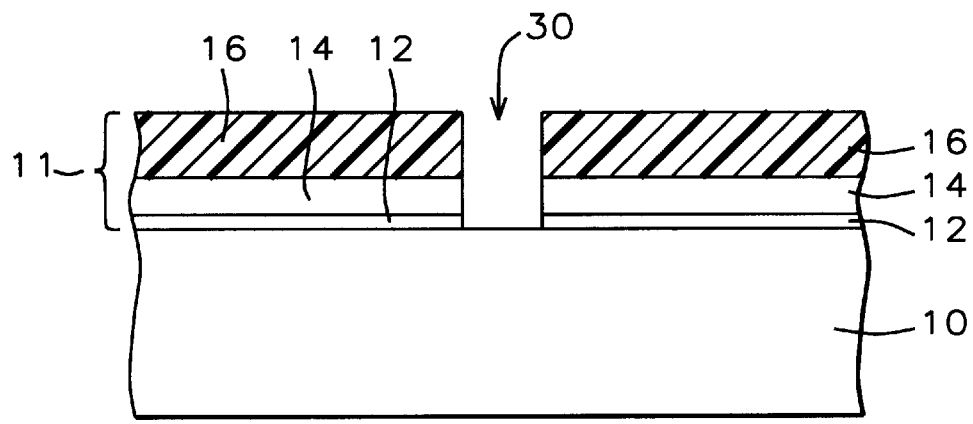
FIG. 2 through FIG. 8 are cross sections of a portion of an in process silicon wafer showing the processing steps of the embodiment of this invention.

In a preferred embodiment of this invention a <100> oriented monocrystalline p-type silicon wafer is provided. Referring to FIG. 2, a multilayer mask 11 is formed over the silicon wafer 10 by first forming a pad oxide by thermally oxidizing the wafer 10 and then depositing a layer of silicon nitride 14 over the pad oxide 12. Procedures for the formation of the multilayer mask 11 are well known and widely practiced. The silicon nitride later 14 is typically deposited by low pressure chemical vapor deposition(LPCVD).

An opening 30 is patterned in the silicon nitride layer 14 and in the subjacent pad oxide layer 12, for example by a photoresist mask 16, using RIE with etchants and conditions well known in the art. The thicknesses of the silicon nitride layer and the photoresist layers are chosen in the framework of the manufacturing technology in such a way that, for the purpose of the current invention, they protect the masked areas from ion penetration during the subsequent ion implantation procedure. It is to be understood that other materials and additional layers may be used to form the mask 11 without departing from the spirit of the current invention.

Figure 3:
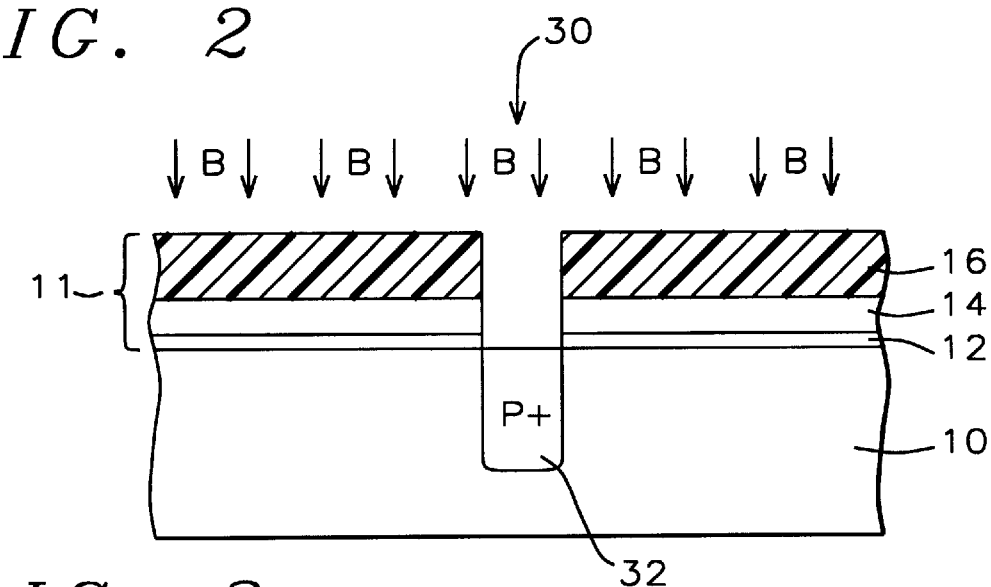

Referring next to FIG. 3, the wafer 10 is subjected to a sequence of boron ion implantation steps which may consist of a stepped or a continuous variation of implant energy from a low value of about 25 keV to a high value which depends upon the depth of the trench desired. In the current embodiment a trench of approximately 0.5 microns in depth is sought which requires a high implant energy of approximately 140 keV. The dosage is tailored to compensate for the increased lateral straggle at the higher energies. Table I gives a sequence of three ion implantation steps which, after a subsequent rapid thermal anneal, produce a smooth concentration profile for forming a 0.5 micron deep trench.

TABLE 1

Sequence of ion implantations for a 0.5 micron trench of uniform profile

| Implant | Dose (Ions/cm$^2$) | Energy (keV) | Mean Depth (Å) |
|---------|--------------------|--------------|----------------|
| 1 | 5 × 10$^{15}$ | 140 | 4,000 |
| 2 | 5 × 10$^{15}$ | 80 | 2,188 |
| 3 | 5 × 10$^{15}$ | 25 | 700 |

Figure 4:
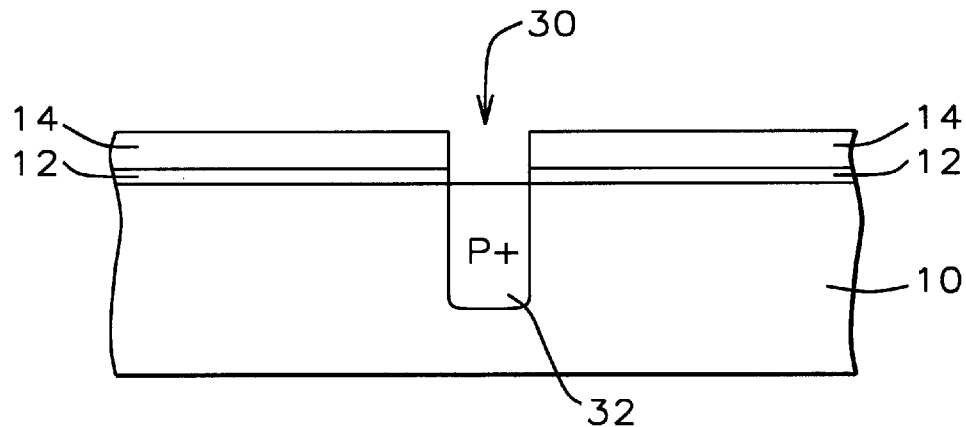

Referring to FIG. 4, after the completion of the ion implantation, the photoresist layer 16 is removed, either with conventional liquid strippers or by oxygen plasma ashing. A rapid thermal anneal is next applied to the wafer wherein the surface region is heated to between about 850 and 950° C. for a period of less than about 30 seconds. This anneal allows interstitial boron atoms to migrate to stable lattice positions and also provides a local smoothing of the concentration profile. Annealing for more than 30 seconds will cause excessive lateral diffusion thereby widening the shape.

The wafer is next placed into an aqueous etchant made by combining between about 0.9 and 1.1 cc. of 49% HF, between about 45 and 55 cc. of 70% $HNO_3$ and between about 18 and 22 cc. of $H_2O$. This corresponds to about 0.4 moles/liter HF and about 11 moles/liter $HNO_3$.

Figure 5:
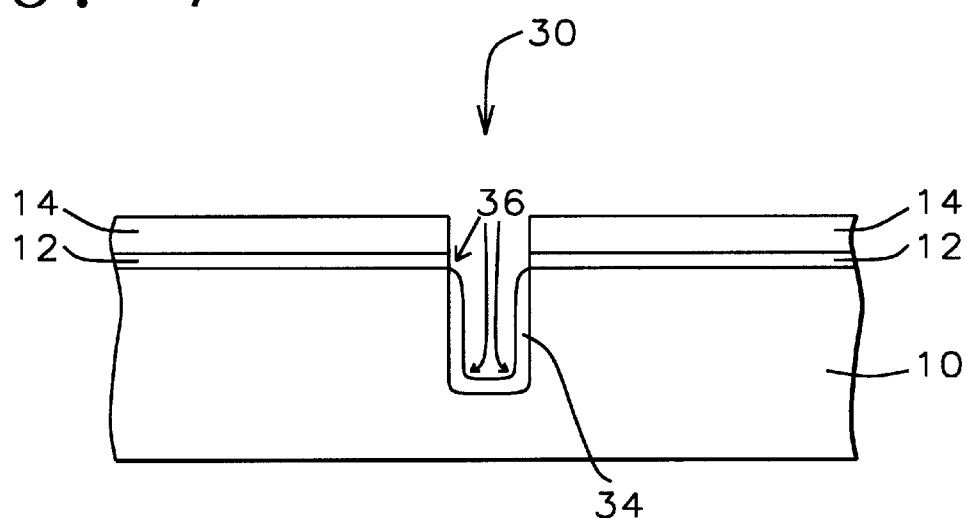

The boron implanted region 32 is of high and essentially uniform concentration. At the periphery of the region 32, the boron concentration falls off rapidly. The etch rate of the essentially uniformly doped region 32 is rapid and likewise falls off rapidly as the boron concentration decreases at the periphery. By calibration of the etchant solution it is possible to determine an etch time whereupon a central portion of the region 32 has been etched away and a narrow peripheral region having lower doping concentration remains. At this point the etchant is quenched by rinsing in deionized $H_2O$ with the resultant profile as shown in FIG. 5. The remaining peripheral region 34 is sufficiently doped to form a highly effective channel stopping layer. Because the boron concentration falls off rapidly and the etch rate slows accordingly, the etch front becomes nearly isoplethic, forming a thin p+ shell which uniformly lines the trench. In addition the smooth rounded corners 36 of the trench are conducive to lower stress in these regions resulting in reduced junction leakage and stress related silicon damage.

Figure 6:
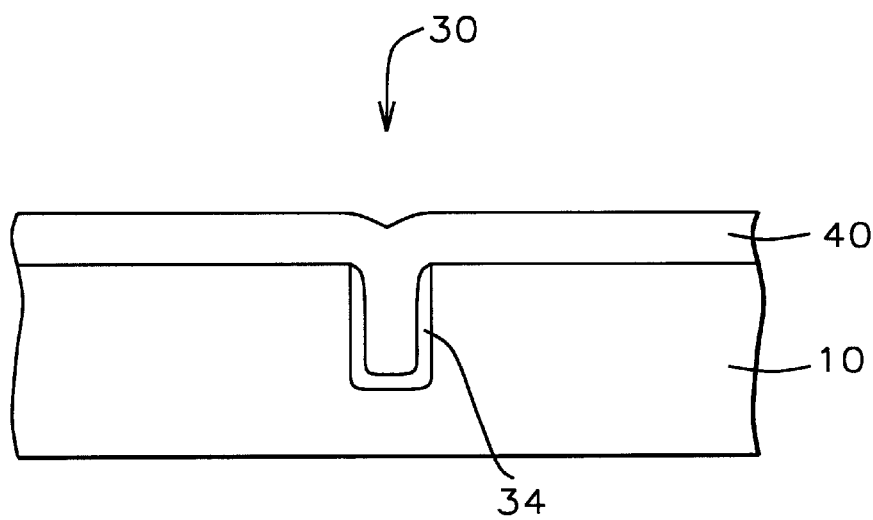
Figure 7:
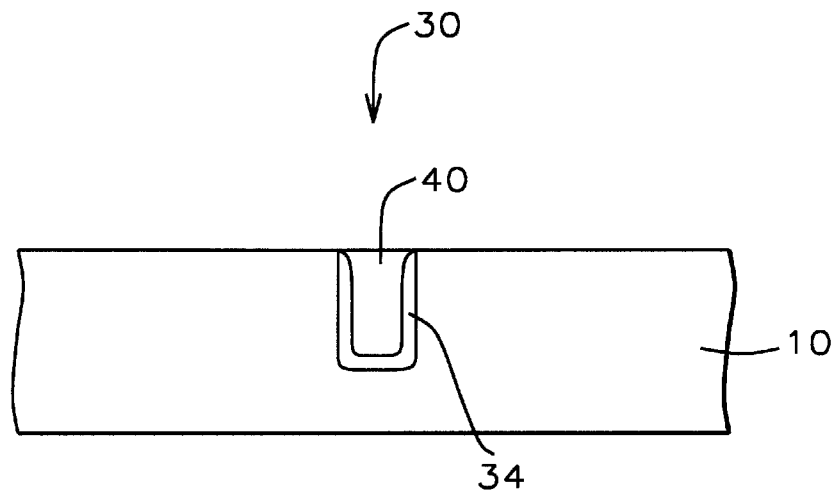

Referring now to FIG. 6, the silicon nitride 14 and pad oxide 12 masking layer is removed, preferably by wet etching, and the trench is filled with a dielectric material 40, for example silicon oxide, which is deposited by well known CVD methods. Alternatively, a thin thermal oxide(not shown) may be grown over the surface and polysilicon deposited to provide the trench filling material. Such methods of trench filling are well known to those familiar with the art. A RIE using established etchants and conditions is next applied to etch back the filler layer 40 to the silicon surface. Alternately, the well known planarization technique of chemical mechanical polishing(CMP) may be used to remove the excess filler material 40. The completed shallow trench isolation(STI) is shown in FIG. 7.

Figure 8:
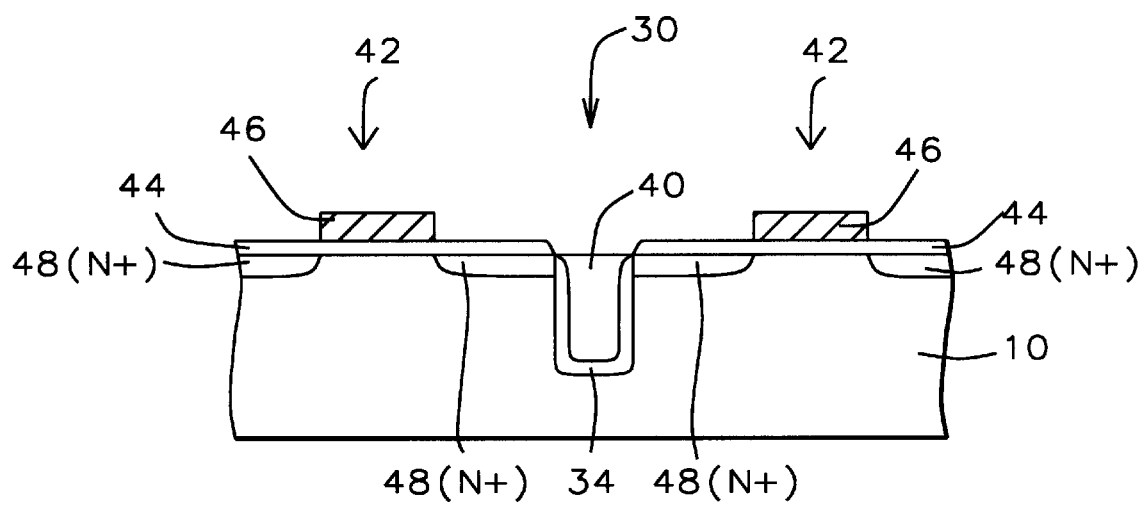

Referring next to FIG. 8, semiconductive devices such as self aligned polysilicon gate MOSFETs 42 are next formed in the silicon regions adjacent to the filled STI 30. The methods of formation of these devices 42 are varied and are well known to those in the field. A gate oxide 44 is thermally grown, and polysilicon gate electrodes 46 are formed by photolithographic patterning of a deposited layer of polysilicon. n-type impurity ions are then implanted using the polysilicon electrodes as a mask to form source/drain regions 48 of n-channel MOSFETs.

An important advantage of STI is readily apparent in FIG. 8. In contrast to LOCOS, STI is planar with the silicon surface. Because RIE is not used to form the trench by the method of this invention, the hereinbefore mentioned problem of polymer encroachment at narrow trench widths does not occur. Trenches of essentially rectangular cross section may be formed having high aspect ratios and widths of less than 0.25 microns.

The embodiment of this invention uses a p-type silicon substrate. It should be well understood by those skilled in the art that n-type silicon may also be used. Similarly, while the embodiment uses boron for the ion implantation to enhance the etching of silicon, other impurity ions may likewise be used to enhance the etching characteristics of the silicon regions wherein the trenches are to be formed.

While the invention has been particularly shown and described to form trenches of a single depth, the concepts and techniques taught by this invention may be extended to form trenches of more than one depth on a single wafer by first implanting all trenches to the specifications of the shallowest trench and then, by successive applications of block out masks to protect the shallower trenches, the deeper trenches may thereafter be ion implanted at higher energies. Finally, all of the trenches may be etched in a single wet etching step.

While the invention has been particularly shown and described with reference to the preferred embodiments thereof, it will be understood by those skilled in the art that various changes in form and details may be made without departing from the spirit and scope of the invention.

What is claimed is:

1. A method for forming a trench in a silicon wafer comprising:
   (a) providing a silicon wafer;
   (b) forming a mask defining a trench over said silicon wafer;
   (c) implanting said silicon wafer with ions in a plurality of ion implantation steps thereby forming an implanted region having a trench profile;
   (d) annealing said silicon wafer; and
   (e) etching said implanted region with a wet etch thereby forming a trench.

2. The method of claim 1 wherein said mask comprises silicon nitride over silicon oxide.

3. The method of claim 1 wherein said ions are selected from the group consisting of boron, arsenic, phosphorous, and antimony.

4. The method of claim 1 wherein said etchant is a composition containing components selected from the group consisting of HF, $HNO_3$, and KOH.

5. The method of claim 1 wherein said ions are boron and said annealing is rapid thermal annealing at a temperature greater than 850° C.

6. The method of claim 1 wherein said trench has a width of less than 0.25 microns.

7. A method for forming trench isolation on a p-type silicon wafer comprising:
   (a) providing a p-type silicon wafer;
   (b) forming a mask defining a trench over said silicon wafer;
   (c) implanting said silicon wafer with boron in a plurality of ion implantation steps thereby forming an implanted region having a trench profile;
   (d) annealing said silicon wafer;
   (e) partially etching said implanted region with a wet etch thereby forming a trench while retaining a peripheral portion of said implanted region, said peripheral portion forming a continuous lining of enhanced boron concentration in said trench comprising a channel stop; and
   (f) filling said trench with a material thereby forming trench isolation.

8. The method of claim 7 wherein said mask comprises silicon nitride over silicon oxide.

9. The method of claim 7 wherein said etchant is a composition containing components selected from the group consisting of HF, $HNO_3$, and KOH.

10. The method of claim 7 wherein said annealing is rapid thermal annealing at a temperature greater than 850° C.

11. The method of claim 7 wherein said material is silicon oxide.

12. The method of claim 7 wherein said material comprises polysilicon over silicon oxide.

13. The method of claim 7 wherein said trench has a width of less than 0.25 microns.

14. A method for forming integrated circuit devices on a silicon wafer having trench isolation comprising:
- (a) providing a silicon wafer;
- (b) forming a mask defining a trench over said silicon wafer;
- (c) implanting said silicon wafer with boron ions in a plurality of ion implantation steps thereby forming an implanted region having a trench profile;
- (d) annealing said silicon wafer;
- (e) etching said implanted region with a wet etch thereby forming a trench;
- (f) filling said trench with a material thereby forming trench isolation; and
- (g) forming semiconductive devices on said silicon wafer adjacent to said trench isolation.

15. The method of claim 14 wherein said mask comprises silicon nitride over silicon oxide.

16. The method of claim 14 wherein said etchant is a composition containing components selected from the group consisting of HF, $HNO_3$, and KOH.

17. The method of claim 14 wherein said annealing is rapid thermal annealing at a temperature greater than 850° C.

18. The method of claim 14 wherein said semiconductive devices are n-channel MOSFETs.

19. The method of claim 18 wherein said etching of said implanted region is quenched to retain a peripheral portion of said implanted region, which forms a continuous lining with enhanced boron concentration thereby providing a channel stop.

20. The method of claim 14 wherein said material is silicon oxide.

21. The method of claim 14 wherein said material comprises polysilicon over silicon oxide.

22. The method of claim 14 wherein said trench has a width of less than 0.25 microns.

* * * * *